United States Patent
Hayashida

(10) Patent No.: US 7,368,768 B2
(45) Date of Patent: May 6, 2008

(54) SEMICONDUCTOR INTEGRATED CIRCUIT DEVICE WITH PROTECTION CAPABILITY FOR PROTECTION CIRCUITS FROM STATIC ELECTRICAL CHARGE

(75) Inventor: Yoko Hayashida, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 44 days.

(21) Appl. No.: 11/520,643

(22) Filed: Sep. 14, 2006

(65) Prior Publication Data
US 2007/0063203 A1 Mar. 22, 2007

(30) Foreign Application Priority Data
Sep. 16, 2005 (JP) ............... 2005-270302

(51) Int. Cl.
*H01L 27/10* (2006.01)
*H01L 29/73* (2006.01)
(52) U.S. Cl. ........................ 257/209; 361/55
(58) Field of Classification Search ........... 257/355, 257/356, 360, 362, E23.15, 209, 81, 88, E23.149
See application file for complete search history.

(56) References Cited

U.S. PATENT DOCUMENTS

| | | | |
|---|---|---|---|
| 5,477,413 A | * 12/1995 | Watt | ............. 361/56 |
| 6,327,125 B1 | 12/2001 | Colclaser et al. | |
| 6,365,938 B2 | * 4/2002 | Lee et al. | ............. 257/355 |
| 6,433,403 B1 | * 8/2002 | Wilford | ............. 257/529 |
| 7,098,491 B2 | * 8/2006 | Hsieh | ............. 257/209 |
| 2001/0017755 A1 | 8/2001 | Toyoshima | |

FOREIGN PATENT DOCUMENTS

| | | |
|---|---|---|
| JP | 2001-244338 A | 9/2001 |
| JP | 2003-518745 A | 6/2003 |

\* cited by examiner

*Primary Examiner*—Mark A. Robinson
*Assistant Examiner*—Selim Ahmed
(74) *Attorney, Agent, or Firm*—Foley & Lardner LLP

(57) ABSTRACT

Semiconductor Integrated Circuit (IC) devices such as diode and MOSFET that protect circuits from Electrostatic Discharge (ESD) are formed. A diode is formed by an N+ (or P+) and P+ (or N+) diffusion layers within an N (or P) well on a P (or N) type semiconductor substrate. The N+ (or P+) diffusion layer of the diode is connected to the power supply. Additionally, an NMOSFET (or PMOSFET) is formed with N+ (or P+) source/drain regions and a gate on the same P (or N) type substrate. The P+ (or N+) diffusion layer of the diode and the N+ (or P+) source/drain regions of the NMOSFET (or PMOSFET) are connected to a fuse through second and first levels of metal wirings.

6 Claims, 7 Drawing Sheets

SEMICONDUCTOR INTEGRATED CIRCUIT DEVICE WITH PROTECTION CAPABILITY FOR PROTECTION CIRCUITS FROM STATIC ELECTRICAL CHARGE

This application is based upon and claims the benefit of priority from Japanese Patent Application No. 2005-270302 filed on Sep. 16, 2005, the content of which is incorporated by reference.

BACKGROUND OF THE INVENTION

1. Field of the Invention

The present invention relates to a semiconductor integrated circuit device.

2. Description of the Related Art

In a semiconductor integrated circuit, some locations (such as input/output terminals) are not provided with protective film for protecting circuits from the discharge of static electricity, the metal wiring layer being exposed in these locations.

Static electrical discharge can easily occur during the assembly process of a semiconductor integrated circuit. After completion of assembly, the reduced number of input/output terminals in which the metal wiring layer is exposed and the increased electrostatic capacitance of the semiconductor substrate decrease the necessity for protecting input/output terminals.

Semiconductor integrated circuits that include electrostatic discharge protection circuits (hereinbelow abbreviated as "ESD protection circuits") are known as one method of protecting locations in which the metal wiring layer of the semiconductor integrated circuits is exposed.

Connection between an ESD protection circuit and a main circuit causes delays in the operation of the main circuit, and ESD protection circuits are therefore cut off from main circuits after assembly has been completed.

Document 1 (JP-A-2001-244338) and Document 2 (JP-A-2003-518745) disclose protection function release methods for cutting fuses that connect main circuits with ESD protection circuits after completion of assembly.

In memory devices such as DRAM (Dynamic Random Access Memory), memory cells included in the memory device are connected to main circuits by way of fuses. When a memory cell has been damaged, the fuse that connects the damaged memory cell to the main circuits is cut, following which a normal memory cell is connected to the main circuits.

In order to cut the connection between a damaged memory cell and the main circuits, the fuse is irradiated by a laser. The cut surface of a fuse that has been cut by means of laser irradiation is left exposed without being covered by a protective film, and as a result, the cut surface of the fuse is prone to the occurrence of electrostatic discharge.

For example, in the step of mounting a semiconductor package in a ball grid array (BGA) packaging method, there is a potential for the occurrence of electrostatic discharge at the cut surfaces of fuses that are under the suction portion when a semiconductor chip is adhered to a vacuum collet.

In addition, in the step of assembling a multi-chip semiconductor device, there is a potential for the occurrence of electrostatic discharge in the cut surfaces of fuses provided on lower-layer chips that are formed immediately below an upper layer chip.

FIG. 1 is a circuit diagram showing a circuit in which a fuse and a MOS field-effect transistor are connected. In FIG. 1, this circuit includes MOSFET 501 and fuse 502.

When an electric charge resulting from electrostatic discharge is applied to the cut surface of fuse 502, the applied charge is discharged in MOSFET 501.

When the electric charge is discharged in MOSFET 501, the potential exists for damage to the MOSFET 501.

FIG. 2 is a sectional view of the circuit shown in FIG. 1.

In FIG. 2, semiconductor substrate 601 includes N+ diffusion layers 606 and 607 and gate 608. In addition, N+ diffusion layer 606 N+ diffusion layer 607 and gate 608 form MOSFET 602.

When an electric charge is applied to the cut surface of fuse 604 by an electrostatic discharge, the applied electric charge is discharged in N+ diffusion layer 607 by way of first metal wiring layer 603 and second metal wiring layer 605. The electric charge that is discharged in N+ diffusion layer 607 can potentially damage MOSFET 602.

Documents 1 and 2 disclose no methods of protecting circuits from electrostatic discharge that occurs in the cut surfaces of fuses.

SUMMARY OF THE INVENTION

It is an object of the present invention to provide a semiconductor integrated circuit device that enables protection of a circuit from electrostatic discharge that occurs at the cut surface of a fuse.

A semiconductor integrated circuit device of the present invention for achieving the above-described object includes: a semiconductor substrate, a circuit, power supply wiring, a fuse, and a protection circuit.

The semiconductor substrate is of one conduction type.

The circuit is formed on the substrate.

The power supply wiring is connected to the circuit.

The fuse is connected to the circuit.

The protection circuit protects said circuit, wherein the protection circuit includes a first diffusion layer, a well layer, a second diffusion layer, a third diffusion layer, and wiring.

The first diffusion layer is of the opposite conduction type, and is formed on the substrate.

The well layer is of the opposite conduction type and is formed in the substrate.

The second diffusion layer is of the conduction type and is formed on the well layer.

The third diffusion layer is of the opposite conduction type, is connected to the power supply wiring, forms a diode with the second diffusion layer, and further, is formed in the well layer.

The wiring is connected to the first diffusion layer, the second diffusion layer, and the fuse.

According to the above-described invention, a diode is formed by a semiconductor substrate of one conduction type and a first diffusion layer of the opposite conduction type, and a diode is formed by a second diffusion layer of the conduction type and a third diffusion layer of the opposite conduction type. In addition, a fuse is connected to the first diffusion layer of the opposite conduction type that forms a diode with the semiconductor substrate of the conduction type. The fuse is further connected to the second diffusion layer of the conduction type that forms a diode with the third diffusion layer of the opposite conduction type that is connected to the power supply wiring.

Thus, if the conduction type is the P-type, when electrostatic discharge causes a negative charge to be applied to the cut surface of a fuse, a forward voltage is applied to the diode formed by the first diffusion layer and the semiconductor substrate, and a reverse voltage is applied to the diode formed by the second diffusion layer and the third diffusion layer, whereby the applied negative electric charge can be discharged to the semiconductor substrate. Alternatively, when electrostatic discharge causes a positive electric charge to be applied to the cut surface of the fuse, a reverse voltage is applied to the diode formed from the first diffusion layer and the semiconductor substrate, and a forward voltage is applied to the diode formed by the second diffusion layer and the third diffusion layer, whereby the applied positive electric charge can be discharged to the power supply wiring.

On the other hand, if the conduction type is the N-type, when electrostatic discharge causes a negative electric charge to be applied to the cut surface of a fuse, the negative electric charge flows toward the third diffusion layer from the second diffusion layer, and the applied negative charge can be discharged to the power supply wiring. Alternatively, when electrostatic discharge causes a positive electric charge to be applied to the cut surface of the fuse, the positive electric charge flows toward the semiconductor substrate from the first diffusion layer, and the applied positive charge can be discharged to the semiconductor substrate.

Accordingly, even in the event that a positive charge or negative charge is applied to the cut surface of a fuse, this positive charge or negative charge can be discharged, and the circuit can be protected from the occurrence of an electrostatic discharge at the cut surface of a fuse.

The semiconductor integrated circuit device of the present invention is further preferably a semiconductor integrated circuit device as described below:

The circuit contains a field-effect transistor.

The first diffusion layer is the source or drain of the field-effect transistor.

Because the source or drain of the field-effect transistor also serves as the first diffusion layer according to the above-described invention, a circuit can be protected without adding a new diffusion layer, and the present invention thus can reduce the increase of elements of the semiconductor integrated circuit.

In addition, the semiconductor integrated circuit device of the present invention is preferably a semiconductor integrated circuit device as described below:

There are a plurality of fuses, first diffusion layers, second diffusion layers, third diffusion layers, and wiring.

Each first diffusion layer corresponds to any of the plurality of fuses.

Each second diffusion layer is formed in a well layer that corresponds to any of the plurality of fuses.

Each third diffusion layer is formed in a well layer that corresponds to any of the plurality of second diffusion layers, and further, forms a diode with the corresponding second diffusion layer.

The wiring connects the fuses to the first diffusion layers and the second diffusion layers that correspond to the fuses.

According to the above-described invention, a plurality of diodes can be provided in the same well layer, and as a result, the present invention can reduce the increase of elements of a semiconductor integrated circuit.

The semiconductor integrated circuit device of the present invention includes: a semiconductor substrate, circuits, power supply wiring, fuses and a protection circuit.

The semiconductor substrate is of the conduction type.

The circuits are formed on the semiconductor substrate.

The power supply wiring is connected to the circuits.

The fuses are connected to the circuits.

The protection circuit protects said circuits, wherein the protection circuit includes first diffusion layers, well layers, second diffusion layers, and wiring.

The first diffusion layers are of the opposite conduction type and are formed on the substrate.

The well layers are of the opposite conduction type and are formed in the substrate.

The second diffusion layers are of the conduction type and are formed on the well layers.

The third diffusion layers are of the conduction type, are connected to the power supply wiring, are formed in the well layers, and, further, with the second diffusion layers, form the sources and drains of field-effect transistors.

The wiring is connected to the first diffusion layers, the second diffusion layers, and the fuses.

According to the present invention, a diode is formed by the semiconductor substrate of one conduction type and the first diffusion layer of the opposite conduction type; and the source and drain of a field-effect transistor are formed by the second diffusion layer of the conduction type and the third diffusion layer of the conduction type. In addition, a fuse is connected to the first diffusion layer of the opposite conduction type that, with the semiconductor substrate of the conduction type, forms a diode. The fuse is further connected to the second diffusion layer of the conduction type that, with the third diffusion layer of the conduction type that is connected to the power supply wiring, forms the source and drain of a field-effect transistor.

Thus, if the conduction type is the P-type, when electrostatic discharge causes a negative electric charge to be applied to the cut surface of a fuse, the negative electric charge flows from the first diffusion layer to the semiconductor substrate, and the applied negative electric charge can be discharged to the semiconductor substrate. Alternatively, when electrostatic discharge causes a positive electric charge to be applied to the cut surface of a fuse, the positive electric charge flows from the second diffusion layer to the third diffusion layer, and the applied positive electric charge can thus be discharged to the power supply wiring by way of the source and drain of a field-effect transistor.

Alternatively, if the conduction type is the N-type, when electrostatic discharge causes a negative electric charge to be applied to the cut surface of a fuse, the negative electric charge flows from the second diffusion layer to the third diffusion layer, and the applied negative electric charge can be discharged to the power supply wiring by way of the source and drain of the field-effect transistor. On the other hand, when electrostatic discharge causes a positive electric charge to be applied to the cut surface of a fuse, the positive charge flows from the first diffusion layer to the semiconductor substrate, and the applied positive electric charge can be discharged to the semiconductor substrate.

Accordingly, even when a positive electric charge or a negative electric charge is applied to the cut surface of a fuse, the applied positive electric charge or negative electric charge can be discharged, whereby the circuit can be protected from electrostatic discharge that occurs at the cut surface of a fuse.

The semiconductor integrated circuit device of the present invention is preferably a semiconductor integrated circuit device as described below:

The field-effect transistor is of the depletion type.

According to the above-described invention, an electric charge can be discharged even when voltage is not applied to the gate of the field-effect transistor.

The semiconductor integrated circuit device of the present invention is preferably a semiconductor integrated circuit device as described below:

The circuit includes a field-effect transistor.

According to the above-described invention, an applied positive electric charge or a negative electric charge is discharged by way of the field-effect transistor that is included in the circuit, and as a result, the circuit can be protected by the field-effect transistor without providing a new field-effect transistor, and the present invention can thus reduce the increase of elements of a semiconductor integrated circuit.

The above and other objects, features, and advantages of the present invention will become apparent from the following description with reference to the accompanying drawings which illustrate examples of the present invention.

DETAILED DESCRIPTION OF THE PREFERRED EMBODIMENTS

Figure 1:
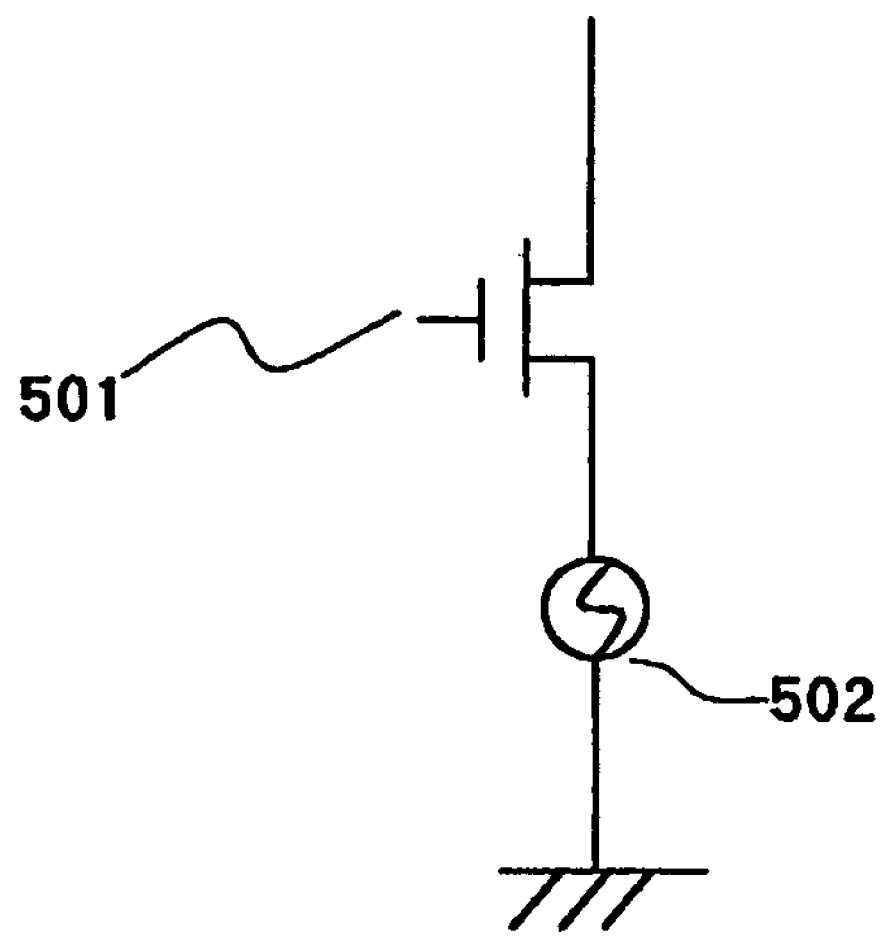
FIG. 1 is a circuit diagram showing an example of the semiconductor integrated circuit device in which a fuse and a circuit are connected.
Figure 2:
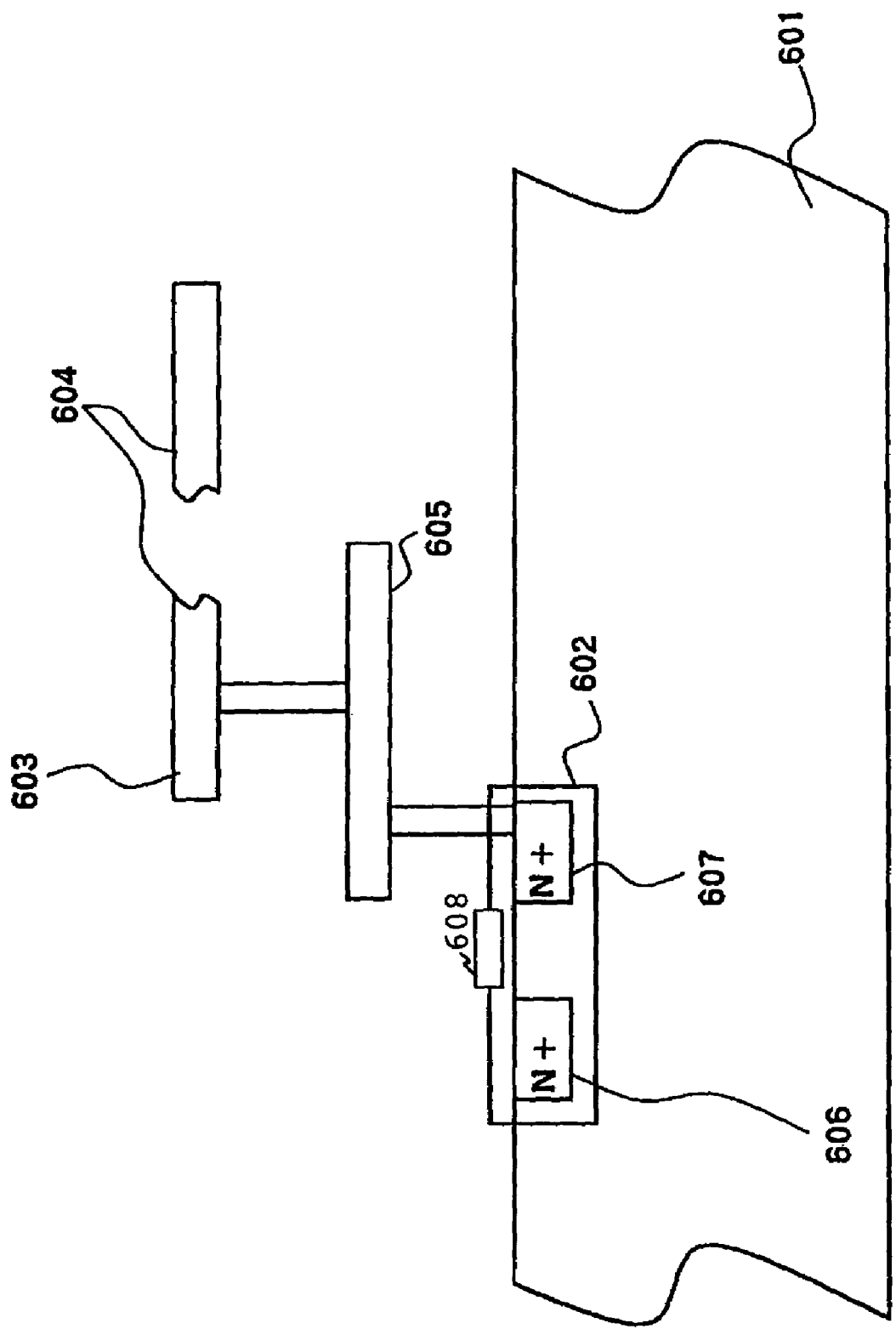
FIG. 2 is a sectional view showing an example of a semiconductor integrated circuit device in which a fuse and a circuit are connected.
Figure 3:
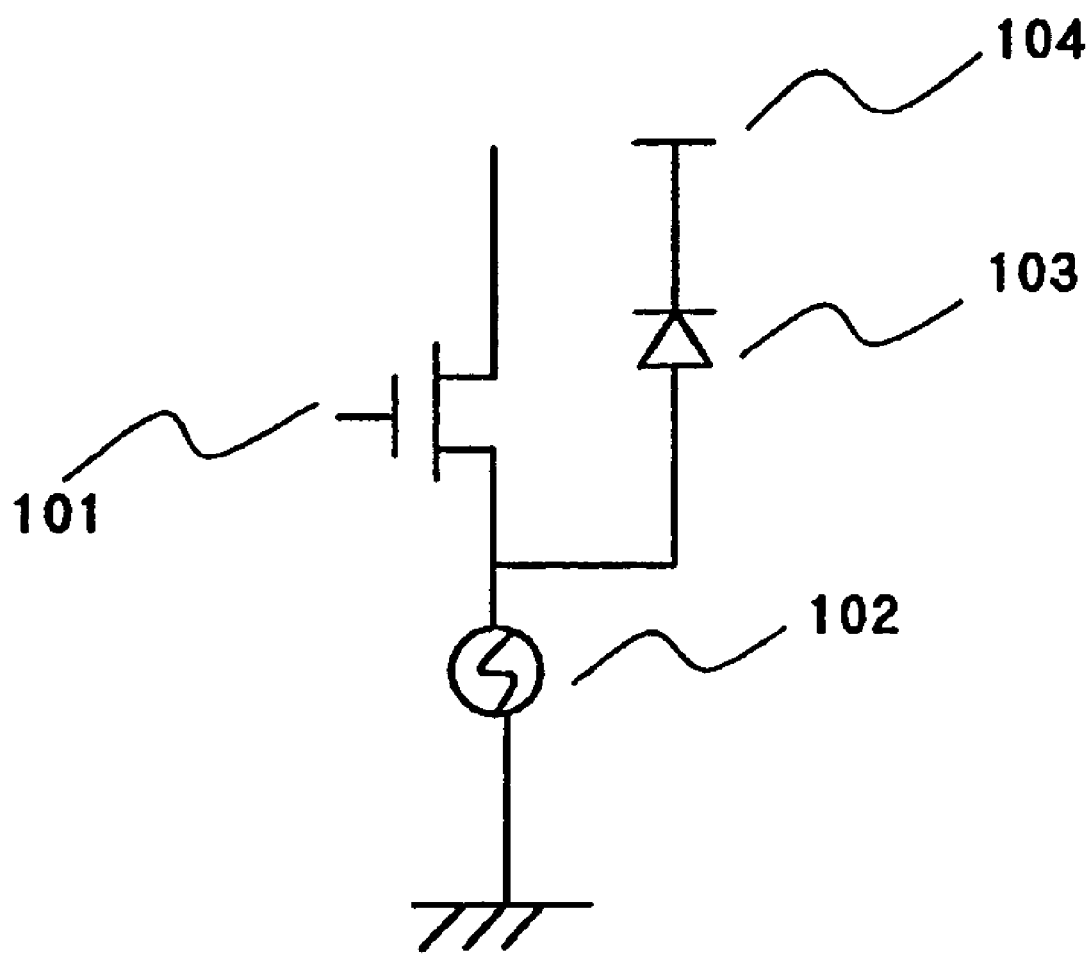
FIG. 3 is a circuit diagram showing a semiconductor integrated circuit device according to an embodiment of the present invention.

FIG. 3 is a circuit diagram showing a semiconductor integrated circuit device according to an embodiment of the present invention.

In FIG. 3, the semiconductor integrated circuit device includes MOSFET 101, fuse 102, diode 103, and power supply wiring 104.

MOSFET 101 is provided within a semiconductor substrate. In addition,

MOSFET 101 is part of a circuit that is to be protected from electrostatic discharge.

Fuse 102 is formed of aluminum. Fuse 102 is cut by irradiation from the outside by a laser.

Power supply wiring 104 is wiring that is connected to the power supply (not shown). In addition, power supply wiring 104 has a large electrostatic capacitance.

Diode 103 and power supply wiring 104 protect MOSFET 101 from electrostatic discharge.

Figure 4:
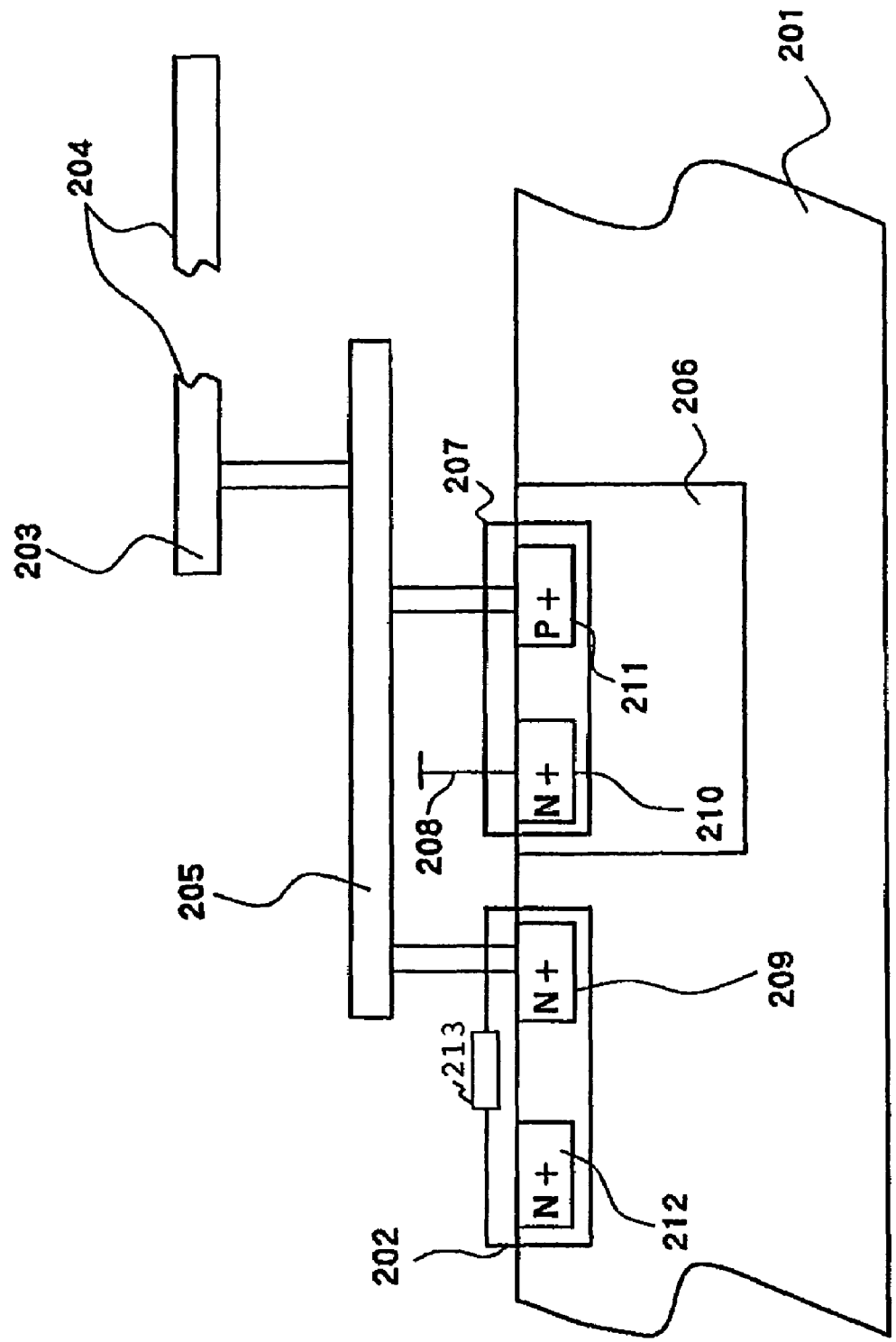
FIG. 4 is a sectional view showing a semiconductor integrated circuit device according to an embodiment of the present invention.

FIG. 4 is a sectional view of the semiconductor integrated circuit shown in FIG. 3.

In FIG. 4, the semiconductor integrated circuit includes semiconductor substrate 201, first metal wiring layer 203, second metal wiring layer 205, and power supply wiring 208.

Semiconductor substrate 201 is a P-type semiconductor substrate, and is connected to second metal wiring layer 205 and power supply wiring 208. In addition, semiconductor substrate 201 has a large electrostatic capacitance.

Semiconductor substrate 201 contains MOSFET 202 and N-well 206.

MOSFET 202 includes N+ diffusion layers 209 and 212 and gate 213.

N+ diffusion layer 209 is the source of MOSFET 202, and is connected to second metal wiring layer 205.

N+ diffusion layer 212 is the drain of MOSFET 202.

Alternatively, N+ diffusion layer 209 may be the drain, and N+ diffusion layer 212 may be the source.

N-well 206 is a well for using a portion of the P-type semiconductor substrate as an N-type semiconductor substrate.

N-well 206 includes diode 207.

Diode 207 includes N+ diffusion layer 210 and P+ diffusion layer 211.

N+ diffusion layer 210 is the cathode electrode of diode 207 and is connected to power supply wiring 208.

P+ diffusion layer 211 is the anode electrode of diode 207 and is connected to second metal wiring layer 205.

On the other hand, N+ diffusion layer 209 and semiconductor substrate 201 form a diode. In this case, N+ diffusion layer 209 is the cathode electrode, and semiconductor substrate 201 is the anode electrode. As a result, fuse 204 is connected to the anode electrode of diode 207 and to the cathode electrode of the diode formed by N+ diffusion layer 209 and semiconductor substrate 201.

First metal wiring layer 203 is formed of aluminum. First metal wiring layer 203 is connected to second metal wiring layer 205. First metal wiring layer 203 is further covered by a protective film (not shown) for protecting the semiconductor integrated circuit from electrostatic discharge.

First metal wiring layer 203 includes fuse 204.

Fuse 204 is cut by laser irradiation.

The cut surface of fuse 204 that has been irradiated by a laser is exposed.

Second metal wiring layer 205 is formed of tungsten, and is connected to semiconductor substrate 201 (specifically, to P+ diffusion layer 211 and N+ diffusion layer 209) and to first metal wiring layer 203.

The following explanation regards a case in which an electric charge is applied to the cut surface of fuse 204.

When a negative electric charge is applied to the cut surface of fuse 204, a forward voltage is applied to the diode that is formed by N+ diffusion layer 209 and P-type semiconductor substrate 201, and a reverse voltage is applied to diode 207. As a result, the applied negative electric charge is discharged to semiconductor substrate 201 by way of second metal wiring layer 205 and N+ diffusion layer 209.

Alternatively, when a positive electric charge is applied to the cut surface of fuse 204, a reverse voltage is applied to the diode formed by N+ diffusion layer 209 and P-type semiconductor substrate 201, and a forward voltage is applied to diode 207. As a result, the applied positive electric charge is discharged to power supply wiring 208 by way of second metal wiring layer 205, P+ diffusion layer 211, and N+ diffusion layer 210.

According to the present embodiment, a diode is formed by N+ diffusion layer 209 and P-type semiconductor substrate 201, and in N-well 206, diode 207 is formed by P+ diffusion layer 211 and N+ diffusion layer 210. N+ diffusion layer 210 is connected to power supply wiring 208. Fuse 204 is connected to N+ diffusion layer 209 and P+ diffusion layer 211.

As a result, when electrostatic discharge causes a negative electric charge to be applied to the cut surface of fuse 204, the negative charge flows from N+ diffusion layer 209 to semiconductor substrate 201, whereby the applied negative electric charge can be discharged to semiconductor substrate 201. On the other hand, when electrostatic discharge causes a positive electric charge to be applied to the cut surface of fuse 204, the positive electric charge flows from P+ diffusion layer 211 toward N+ diffusion layer 210, whereby the applied positive electric charge can be discharged to power supply wiring 208.

Accordingly, even when a positive electric charge or negative electric charge is applied to the cut surface of fuse 204, the applied positive or negative electric charge can be discharged. As a result, circuits can be protected from electrostatic discharge that occur at the cut surface of fuse 204. In the present embodiment, N+ diffusion layer 209 is the source or drain of MOSFET 202.

In this case, the source or drain of MOSFET 202 serves as N+ diffusion layer 209, whereby the circuit can be protected without adding new N+ diffusion layers. As a result, the present embodiment can reduce the increase of elements of a semiconductor integrated circuit.

Figure 5:
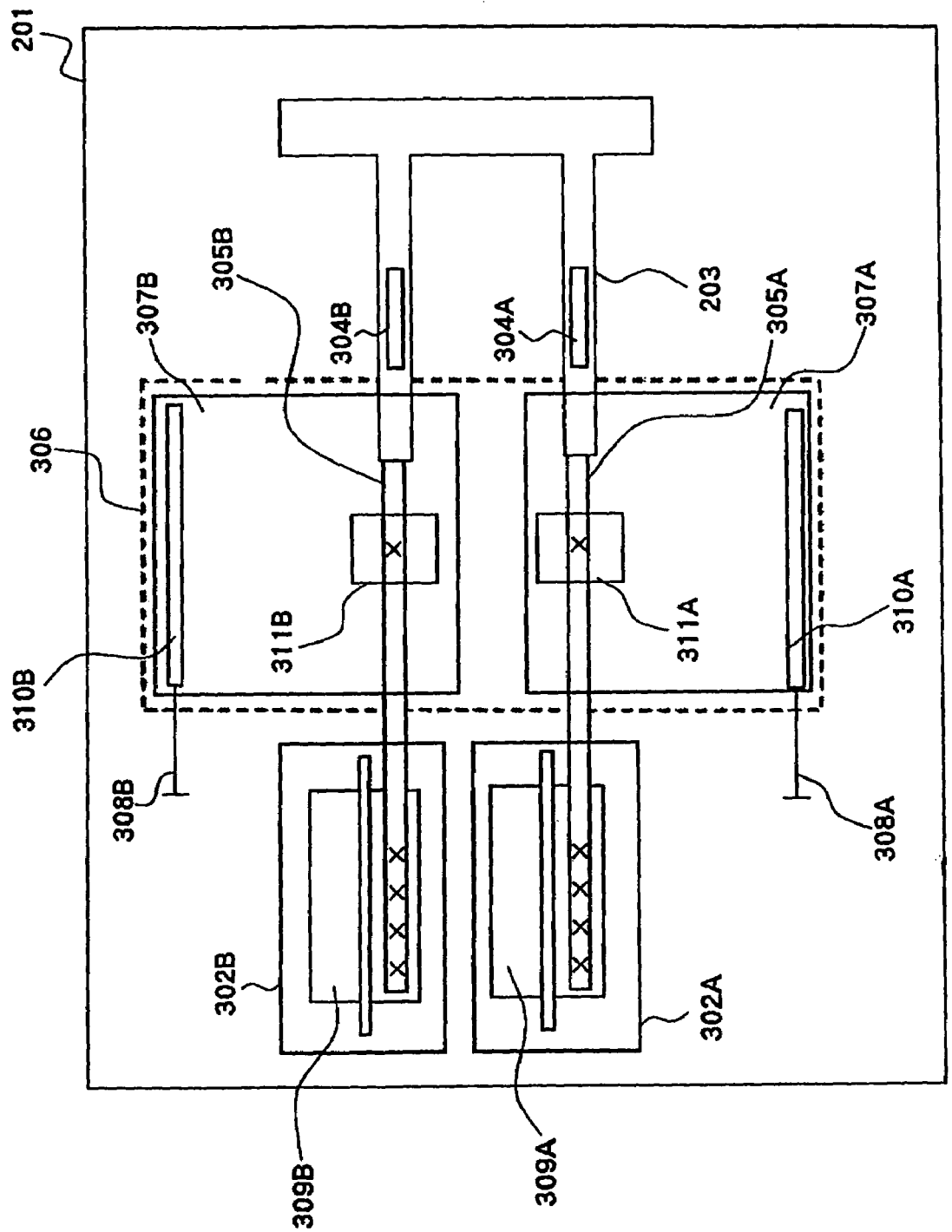
FIG. 5 is a plan view showing an example of a semiconductor integrated circuit device having a plurality of fuses.

FIG. 5 is a plan view showing a semiconductor integrated circuit that includes a plurality of fuses. The following explanation regards a configuration different from that of FIG. 3 and FIG. 4. Elements in FIG. 5 that are identical to elements in FIG. 3 or FIG. 4 are given the same reference numbers.

In FIG. 5, the semiconductor integrated circuit includes semiconductor substrate 201, first metal wiring layer 203, and second metal wiring layers 305A and 305B.

First metal wiring layer 203 includes fuses 304A and 304B.

Fuses 304A and 304B are cut by laser irradiation. When irradiated by a laser, the cut surface of fuse 304A or 304B is exposed.

Fuse 304A is connected to second metal wiring layer 305A, and fuse 304B is connected to second metal wiring layer 305B.

Semiconductor substrate 201 includes N-well 306 and MOSFETS 302A and 302B. MOSFET 302A includes N+ diffusion layer 309A.

N+ diffusion layer 309A is the source or drain of MOSFET 302A and is connected to second metal wiring layer 305A.

MOSFET 302B includes N+ diffusion layer 309B.

N+ diffusion layer 309B is the source or drain of MOSFET 302B and is connected to second metal wiring layer 305B.

N-well 306 includes diodes 307A and 307B.

Diode 307A includes N+ diffusion layer 310A and P+ diffusion layer 311A.

N+ diffusion layer 310A is connected to power supply wiring 308A.

P+ diffusion layer 311A is connected to second metal wiring layer 305A.

Diode 307B includes N+ diffusion layer 310B and P+ diffusion layer 311B.

N+ diffusion layer 310B is connected to power supply wiring 308B.

P+ diffusion layer 311B is connected to second metal wiring layer 305B.

The following explanation regards a case in which an electrostatic discharge causes an electric charge to be applied to the cut surface of a fuse. Explanation first regards a case in which an electric charge is applied to the cut surface of fuse 304A, following which explanation regards a case in which an electric charge is applied to the cut surface of fuse 304B.

When a negative electric charge is applied to the cut surface of fuse 304A, the negative electric charge flows from N+ diffusion layer 309A to P-type semiconductor substrate 201, whereby the applied negative charge is discharged to semiconductor substrate 201 by way of second metal wiring layer 305A and N+ diffusion layer 309A.

Alternatively, when a positive electric charge is applied to the cut surface of fuse 304A, the positive electric charge flows from P+ diffusion layer 311A toward N+ diffusion layer 310A. As a result, the applied positive charge is discharged to power supply wiring 308A by way of second metal wiring layer 305A, P+ diffusion layer 311A, and N+ diffusion layer 310A.

On the other hand, when a negative electric charge is applied to the cut surface of fuse 304B, the negative electric charge flows from N+ diffusion layer 309B toward P-type semiconductor substrate 201. As a result, the applied negative electric charge is discharged to semiconductor substrate 201 by way of second metal wiring layer 305B and N+ diffusion layer 309B.

When a positive electric charge is applied to the cut surface of fuse 304B, the positive electric charge flows from P+ diffusion layer 311B toward N+ diffusion layer 310B. As a result, the applied positive electric charge is discharged to power supply wiring 308B by way of second metal wiring layer 305B, P+ diffusion layer 311B, and N+ diffusion layer 310B.

According to the present embodiment, N+ diffusion layer 309A is placed in correspondence with fuse 304A and N+ diffusion layer 309B is placed in correspondence with fuse 304B. P+ diffusion layer 311A is formed in N-well 306 in correspondence with fuse 304A, and P+ diffusion layer 311B is formed in N-well 306 in correspondence with fuse 304B. N+ diffusion layer 310A forms a diode with P+ diffusion layer 311A, and N+ diffusion layer 310B forms a diode with P+ diffusion layer 311B. Fuse 304A is connected to N+ diffusion layer 309A and P+ diffusion layer 311A. In addition, fuse 304B is connected to N+ diffusion layer 309B and P+ diffusion layer 311B.

In this case, providing a plurality of diodes in N-well 306 enables a reduction of the increase of elements of the semiconductor integrated circuit.

Figure 6:
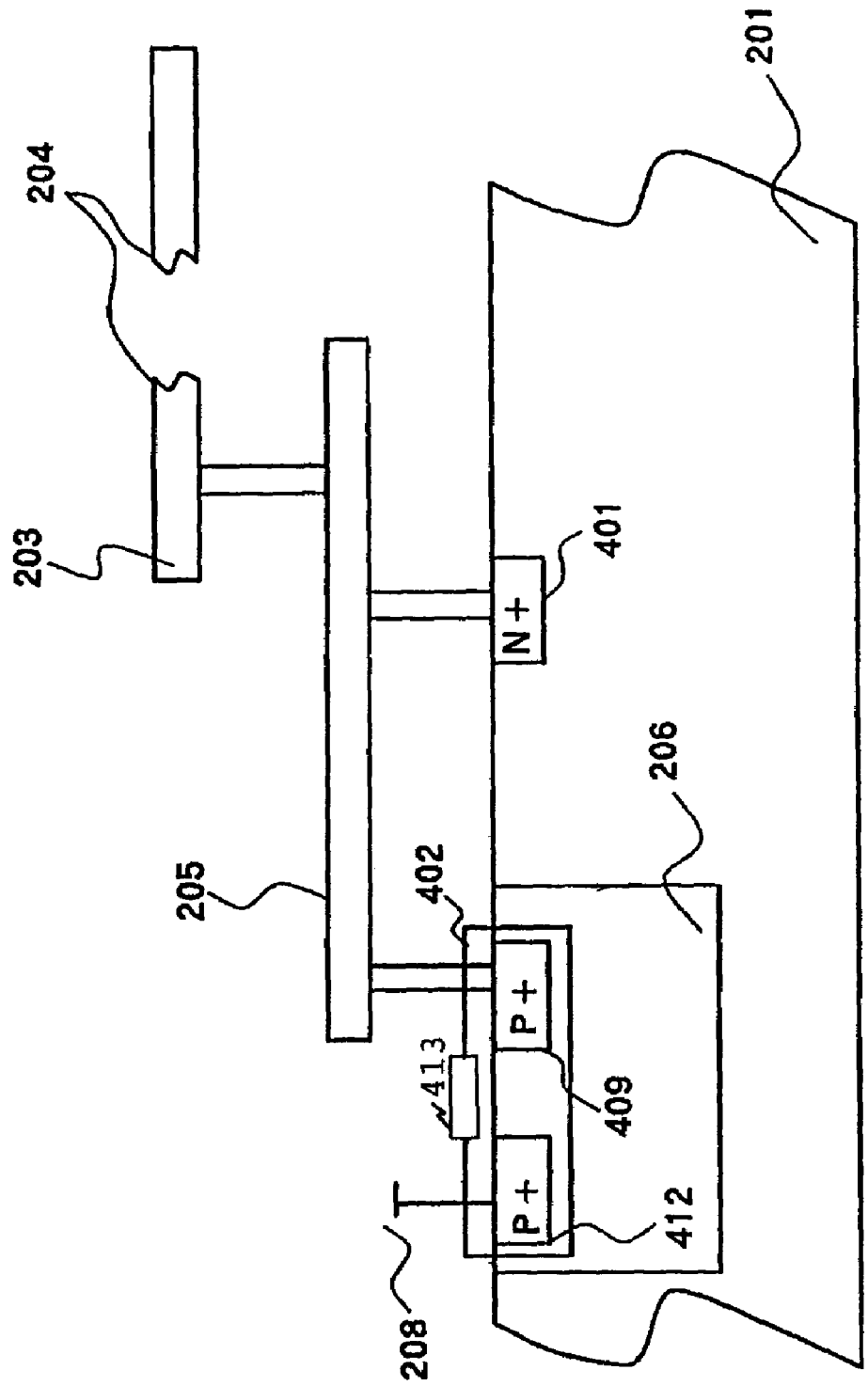
FIG. 6 is a sectional view showing a semiconductor integrated circuit device according to another embodiment of the present invention.

FIG. 6 is a sectional view showing the configuration of the semiconductor integrated circuit of another embodiment. The following explanation chiefly regards a configuration that differs from the semiconductor integrated circuit shown in FIG. 4. In FIG. 6, elements identical to elements in FIG. 4 are given the same reference numbers.

In FIG. 6, the semiconductor integrated circuit includes semiconductor substrate 201, first metal wiring layer 203, second metal wiring layer 205, and power supply wiring 208.

Semiconductor substrate 201 includes N+ diffusion layer 401 and N-well 206.

N+ diffusion layer 401 and semiconductor substrate 201 form a diode.

N-well 206 includes PMOSFET 402.

PMOSFET 402 is of the depletion type, and PMOSFET 402 is a portion of the circuit that is to be protected from electrostatic discharge.

PMOSFET 402 includes P+ diffusion layers 409 and 412 and gate 413.

P+ diffusion layer 409 is the source of PMOSFET 402 and is connected to second metal wiring layer 205.

P+ diffusion layer 412 is the drain of PMOSFET 402 and is connected to power supply wiring 208.

Alternatively, P+ diffusion layer 409 may be the drain, and P+ diffusion layer 412 may be the source.

Second metal wiring layer 205 is connected to semiconductor substrate 201 (specifically, N+ diffusion layer 401 and P+ diffusion layer 409) and first metal wiring layer 203.

Explanation next regards a case in which electrostatic discharge causes an electric charge to be applied to the cut surface of fuse 204.

When electrostatic discharge causes a negative electric charge to be applied to the cut surface of fuse 204, the negative electric charge flows from N+ diffusion layer 401 to P-type semiconductor substrate 201, whereby the applied negative electric charge is discharged to semiconductor substrate 201 by way of second metal wiring layer 205 and N+ diffusion layer 401.

On the other hand, when electrostatic discharge causes a positive electric charge to be applied to the cut surface of fuse 204, the positive electric charge flows from P+ diffusion layer 409 to P+ diffusion layer 412, whereby the applied positive electric charge is discharged to power supply wiring 208 by way of second metal wiring layer 205, P+ diffusion layer 409, and N+ diffusion layer 412.

According to the present embodiment, a diode is formed by N+ diffusion layer 401 and P-type semiconductor substrate 201, and in N-well 206, the source and drain of PMOSFET 402 are formed by P+ diffusion layer 409 and P+ diffusion layer 412. P+ diffusion layer 412 is connected to power supply wiring 208. Fuse 204 is connected to N+ diffusion layer 401 and P+ diffusion layer 409.

In this way, when electrostatic discharge causes a negative electric charge to be applied to the cut surface of fuse 204, the negative electric charge flows from N+ diffusion layer 401 toward P-type semiconductor substrate 201, whereby the applied negative electric charge can be discharged to semiconductor substrate 201. On the other hand, when electrostatic discharge causes a positive electric charge to be applied to the cut surface of fuse 204, the positive electric charge flows from P+ diffusion layer 409 toward P+ diffusion layer 412, whereby the applied positive electric charge can be discharged to power supply wiring 208 by way of P+ diffusion layer 409 and P+ diffusion layer 412.

Accordingly, even when a positive electric charge or negative electric charge is applied to the cut surface of fuse 204, the applied positive electric charge or negative electric charge can be discharged. As a result, the circuit can be protected from electrostatic discharges that occur in the cut surface of fuse 204.

In the present embodiment, PMOSFET 402 is of the depletion type.

In this case, an electric charge can be discharged even when voltage is not applied to the gate 413 of PMOSFET 402.

In addition, PMOSFET 402 in the present embodiment is included in the circuit that is to be protected from electrostatic discharge.

Accordingly, the use of PMOSFET 402 that is contained in the circuit that is to be protected enables the protection of the circuit without the additional provision of PMOSFET 402. The present embodiment can therefore reduce the increase of elements of the semiconductor integrated circuit.

In each of the embodiments described hereinabove, the configuration shown in the figure is only one example, -and the present invention is not limited to this configuration.

For example, in each of the embodiments, explanation regarded configurations in which the conduction type is the P-type, and the opposite conduction type is the N-type, but the conduction type may also be the N-type and the opposite conduction type may be the P-type.

Figure 7:
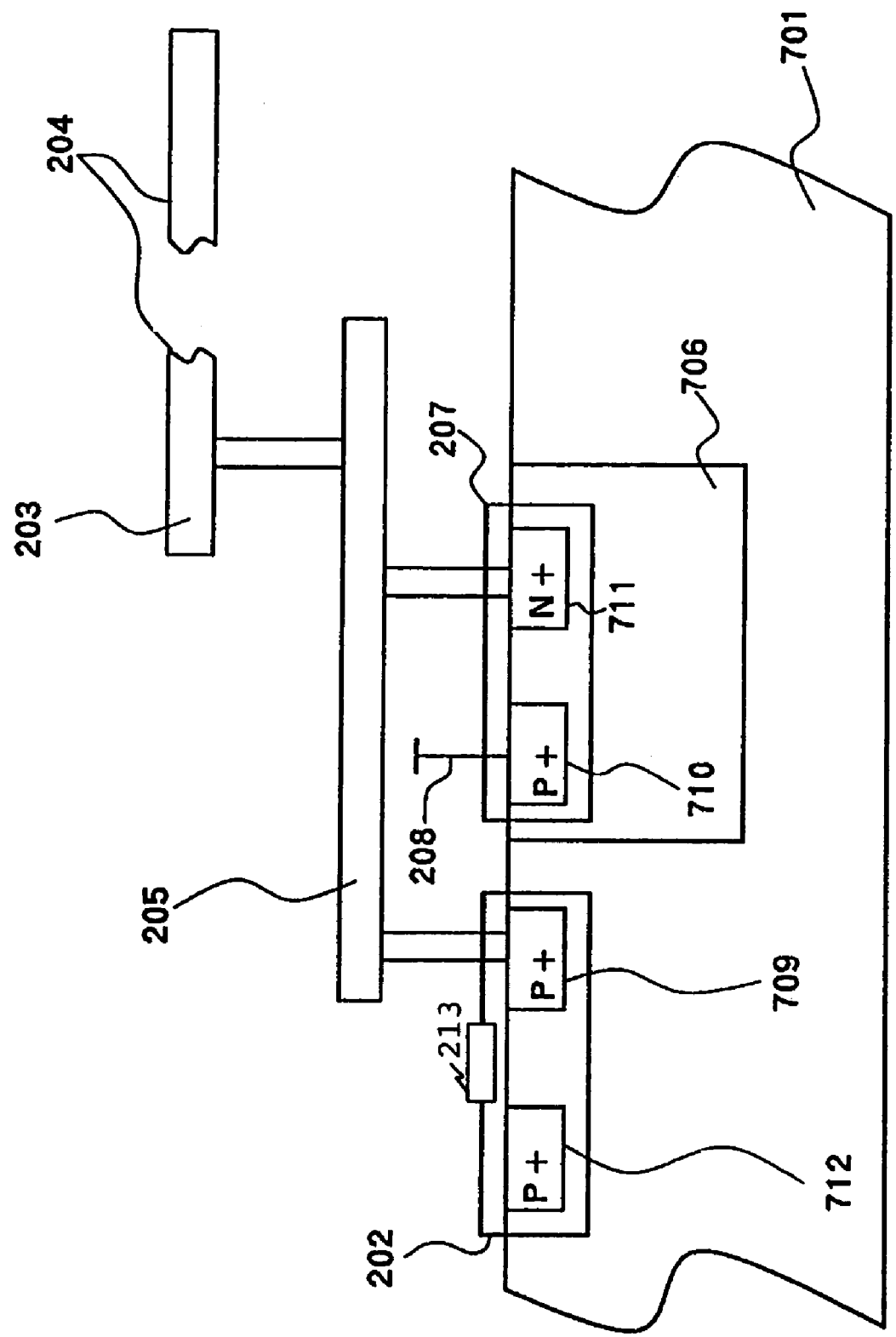
FIG. 7 is a sectional view showing an example of a semiconductor integrated circuit in which the conduction type is the N-type and the opposite conduction type is the P-type.

FIG. 7 is a sectional view showing a semiconductor integrated circuit having the same functions as the semiconductor integrated circuit shown in FIG. 3 and in which the conduction type is the N-type and the opposite conduction type is the P-type.

In FIG. 7, when a negative electric charge is applied to the cut surface of fuse 204, the negative electric charge flows from N+ diffusion layer 711 toward P+ diffusion layer 710, and the applied negative electric charge is discharged to power supply wiring(or ground wiring) 208.

On the other hand, when a positive electric charge is applied to the cut surface of fuse 204, the positive electric charge flows from P+ diffusion layer 709 toward N-type semiconductor substrate 701, whereby the applied positive electric charge is discharged to semiconductor substrate 701

While preferred embodiments of the present invention have been described using specific terms, such description is for illustrative purposes only, and it is to be understood that changes and variations may be made without departing from the spirit or scope of the following claims.

What is claimed is:

1. A semiconductor integrated circuit device comprising:
   a semiconductor substrate of one conduction type;
   circuits formed on said substrate;
   power supply wiring connected to said circuit;
   a fuse connected to said circuit; and
   a protection circuit protects said circuit, wherein said protection circuit comprising;
   a first diffusion layer of an opposite conduction type formed on said substrate,
   a well layer of the opposite conduction type formed in said substrate,
   a second diffusion layer of the conduction type formed in said well layer,
   a third diffusion layer of the opposite conduction type formed in said well layer,
   said third diffusion layer being connected to said power supply wiring and forming a diode with said second diffusion layer; and
   wiring connected to said first diffusion layer, said second diffusion layer, and said fuse.

2. The semiconductor integrated circuit device according to claim 1, wherein:
   said circuit includes a field-effect transistor; and
   said first diffusion layer is a source or drain of said field-effect transistor.

3. The semiconductor integrated circuit device according to claim 1, wherein:
   there is a plurality of each of said fuses, said first diffusion layers, said second diffusion layers, said third diffusion layers, and said wiring;
   each first diffusion layer corresponds to any of said plurality of fuses;
   each second diffusion layer is formed in said well layer that corresponds to any of said plurality of fuses;
   each third diffusion layer is formed in said well layer that corresponds to any of said plurality of second diffusion layers, and further, forms a diode with said corresponding second diffusion layer;
   said plurality of wiring connects said fuses to said first diffusion layers and said second diffusion layers that correspond to the fuses.

4. A semiconductor integrated circuit device comprising:
   a semiconductor substrate of one conduction type;

circuits formed on said semiconductor substrate;
power supply wiring connected to said circuits;
fuses connected to said circuits; and
a protection circuit protects said circuits, wherein said protection circuit comprising;
first diffusion layers of an opposite conduction type formed on said substrate;
well layers of the opposite conduction type formed in said substrate;
second diffusion layers of the conduction type formed in said well layers;
third diffusion layers of the opposite conduction type formed in said well layers, said third diffusion layers being connected to said power supply wiring and, with said first diffusion layers, forming sources and drains of field-effect transistors;
wiring connected to said first diffusion layers, said second diffusion layers, and said fuses.

5. The semiconductor integrated circuit device according to claim 4, wherein said field-effect transistor is of a depletion type.

6. The semiconductor integrated circuit device according to claim 4, wherein said circuits include-said field-effect transistors.

* * * * *